United States Patent
Akiyoshi (10) Patent No.: US 6,825,704 B2
(45) Date of Patent: Nov. 30, 2004

(54) PULSE GENERATION CIRCUIT ENABLING ITS OUTPUT PULSE CYCLE TO BE SHORTENED

(75) Inventor: Hideo Akiyoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/465,548

(22) Filed: Jun. 20, 2003

(65) Prior Publication Data

US 2003/0234671 A1 Dec. 25, 2003

(30) Foreign Application Priority Data

Jun. 24, 2002 (JP) ............................... 2002-182590

(51) Int. Cl.[7] .............................................. H03K 3/017
(52) U.S. Cl. ............................... 327/172; 327/175
(58) Field of Search ............................... 327/170, 172, 327/173, 175

(56) References Cited

U.S. PATENT DOCUMENTS 6,573,780 B2 * 6/2003 Lin et al. ................... 327/536

* cited by examiner

Primary Examiner—Timothy P. Callahan
Assistant Examiner—Cassandra Cox
(74) Attorney, Agent, or Firm—Arent Fox PLLC (57) ABSTRACT

A pulse generation circuit generates an output pulse that is set to its activated level in response to a leading edge of a set pulse. The pulse generation circuit comprises an output stage gate having a first output transistor for having the output pulse to be activated level and a second output transistor for having the output pulse to be deactivated level; a first inverter array, for propagating the set pulse and driving the first output transistor; a second inverter array, for propagating a reset pulse, and for driving the second output transistor. To prevent the trailing edge of the set pulse from being delayed, the pulse generation circuit comprises a reset transistor disposed at an inverter output in the first inverter array, being driven in response to the reset pulse propagating through the second inverter array.

15 Claims, 8 Drawing Sheets

PRIOR ART

PULSE GENERATION CIRCUIT ENABLING ITS OUTPUT PULSE CYCLE TO BE SHORTENED

CROSS-REFERENCE TO RELATED APPLICATIONS

This application is based upon and claims the benefit of priority from the prior Japanese Patent Application No. 2002-182590, filed on Jun. 24, 2002, the entire contents of which are incorporated herein by reference.

BACKGROUND OF THE INVENTION

1. Field of the Invention

The present invention relates generally to a pulse generation circuit that generates an output pulse in response to an input pulse, and more particularly to a pulse generation circuit that can shorten the output pulse cycle.

2. Description of the Related Art

In semiconductor memories such as static RAMs, the word drive circuit for driving a word line is a pulse generation circuit that generates an output pulse to the word line having a relatively heavy load in response to a predetermined control pulse. When receiving a control pulse acting as a trigger, the pulse generation circuit generates an output pulse having a higher drive capability through multi-staged inverters. The last stage of the pulse generation circuit consists of large-sized transistors to output the output pulse by driving an output load with its high drive capability. To drive the large-sized transistors in this output stage, a drive pulse having a larger drive capacity is generated from the control pulse by the multi-staged inverters.

Figure 1:
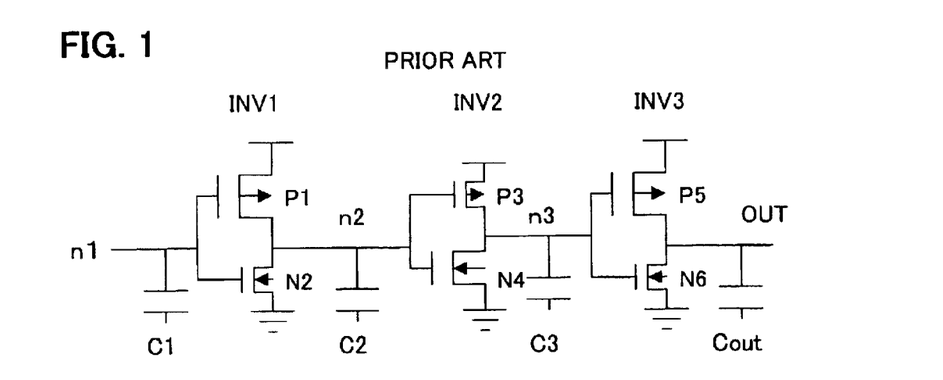
FIG. 1 is a circuit diagram of a conventional pulse generation circuit.
Figure 2:
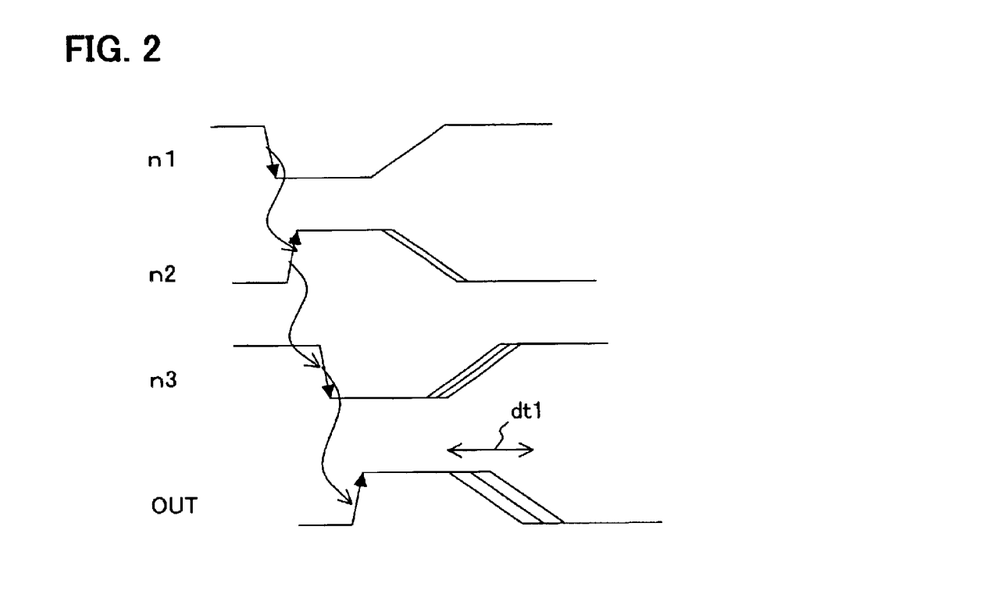
FIG. 2 is a chart illustrating the operational waveforms of the pulse generation circuit shown in FIG. 1.

FIG. 1 illustrates a conventional pulse generation circuit. FIG. 2 illustrates the operational waveforms of the pulse generation circuit shown in FIG. 1. The pulse generation circuit acting as a word line drive circuit drives a word line (not shown) connected to an output terminal OUT, in response to the control pulse at a node n1 input into the pulse generation circuit. The word line is selected by raising the output terminal OUT and the word line returns to the non-selected state by falling the terminal OUT.

To drive the output terminal OUT having a large load capacitance, the size of the transistors in an inverter INV3 at the output stage are made large. The control pulse is propagated being gradually converted into a pulse having a larger drive capability by multi-staged inverters INV1 and INV2. The inverter INV3 in the last stage is driven by the drive pulse generated at a node n3 and having a relatively large drive capability.

The function desired to the word line drive circuit is the function for raising its output terminal at a timing as immediately from the leading edge (the rising edge in FIG. 2) of the control pulse as possible. On the other hand, it is not preferable to make the size of the transistors in the inverter of each stage larger to reduce the delay time period: because each of input load capacitance C1, C2 and C3 accompanying each inverter is also made larger and the propagation time period of the pulse becomes rather longer, and, therefore, the time period between the generation of the control pulse and the generation of the output pulse at the output terminal is made longer.

Therefore, in the conventionally proposed pulse generation circuits, the sizes of the transistors in each inverter are made imbalance. Taking an example of FIG. 1, the size of p-channel transistors P1 and P5 is made large and the size of n-channel transistors N2 and N6 is made small in the inverters INV1 and INV3, and the size of a p-channel transistor P3 is made small and the size of an n-channel transistor N4 is made large in the inverter INV2. In this specification N means n-channel transistor and P means p-channel transistor. By arranging the sizes of the transistors as described above, the leading edge (the edge denoted by the arrow in the FIG. 2) of the control pulse at the node n1 can be propagated to the next nodes n2 and n3 without delay and the delay of the rise edge of the output terminal OUT can be minimized. Furthermore, since the size of one transistor is large and that of another is small in the inverter in each stage, the gate capacitance C1, C2 and C3 being the input load capacitance can be decreased and the delay of propagation of a pulse can be minimized by decreasing the input load capacitance of each inverter.

However, in the above pulse generation circuit consisting of imbalance inverters, the size of the drive transistors in each stage for the trailing edge of the control pulse is small and the drive capability of those transistors is small. As a result, the slopes of the trailing edges at the nodes n2 and n3 are more gradual.

When the fan-out, i.e. the ratio of the output drive current to the output load to drive, of a transistor, such as the transistors P1, N4 and P5 shown in FIG. 1 is small, the influence on the delay time period of the pulse caused by the process variation of the transistors is small. On the other hand, when the fan-out is large such as the transistors N2, P3 and N6, the influence on the delay time period of the pulse caused by the process variation is large. As a result, trailing edge at each node corresponding to the trailing edge of the control pulse may be delayed considerably by the process variation as indicated by dt in FIG. 2.

Since a trailing edge is an edge for the non-selected side, a small delay does not matter. However, pulse generation circuits in recent years have been demanded to narrow the time between the output pulses OUT. For example, in a word line drive circuit of an SCRAM, it is demanded to improve the performance of whole read and write operation by shortening the cycle for driving the word line. Therefore, it is necessary to advance the timing of the leading edge (rise edge) of the output pulse OUT as well as to avoid a delay, which depends on process variations, of the trailing edge (fall edge).

Figure 3:
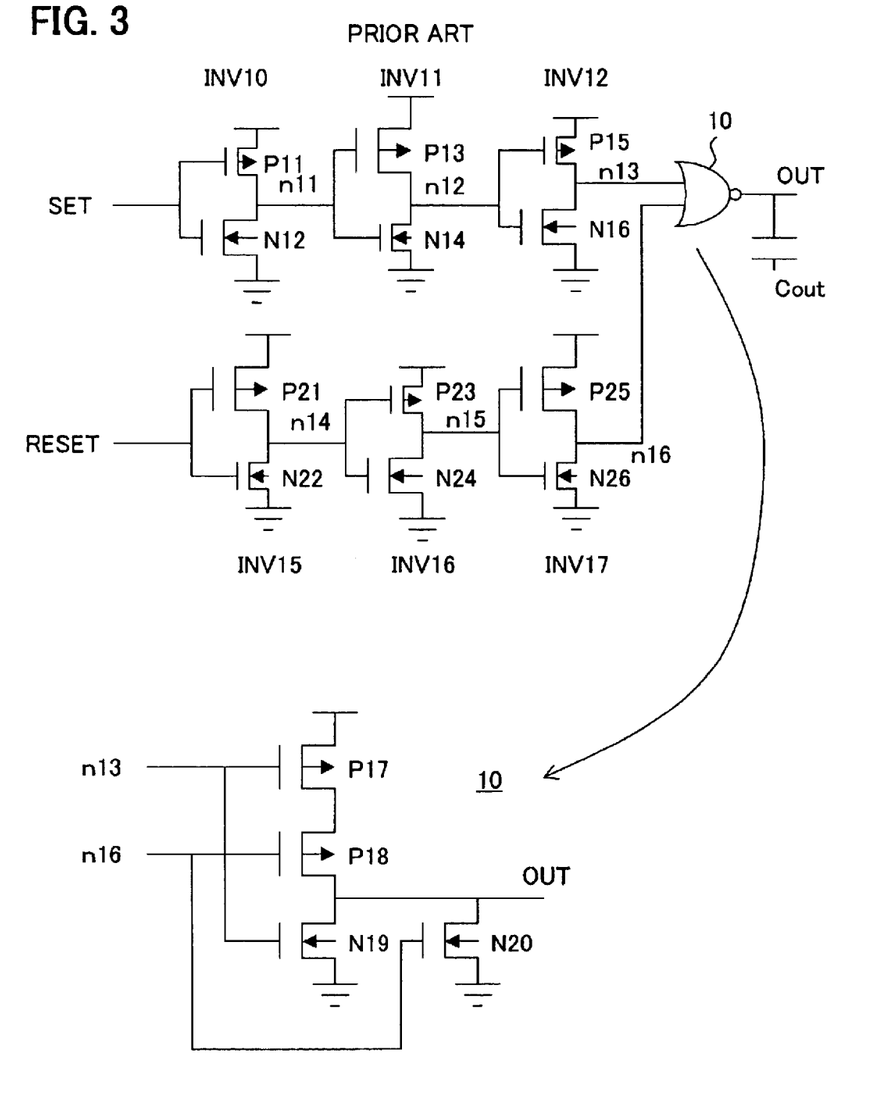
FIG. 3 is a circuit diagram illustrating another conventional pulse generation circuit.
Figure 4:
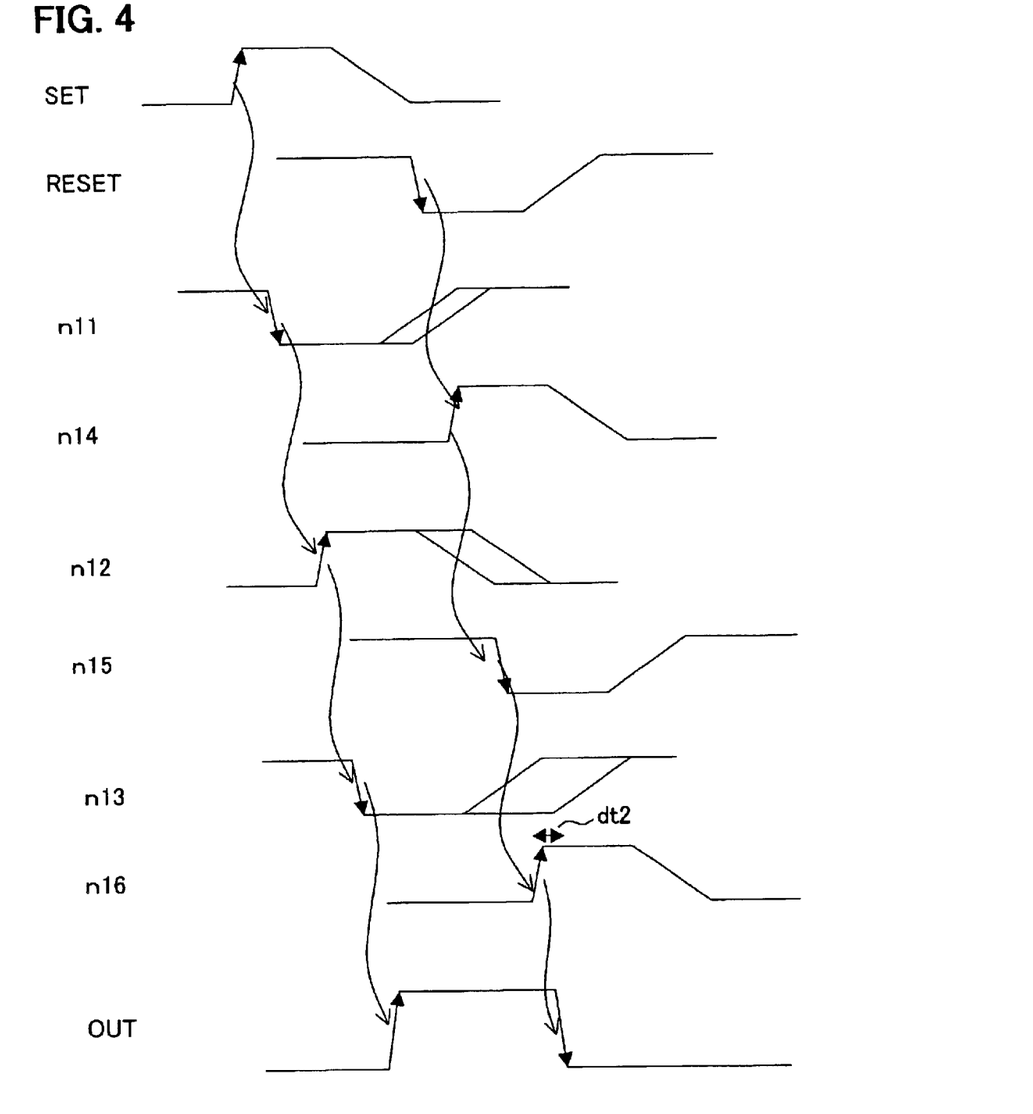
FIG. 4 is a chart illustrating the operational waveforms of the pulse generation circuit shown in FIG. 3.

FIG. 3 illustrates another conventional pulse generation circuit. FIG. 4 illustrates the operational waveforms of the pulse generation circuit shown in FIG. 3. The pulse generation circuit shown in FIG. 3, which is an improvement of the one shown in FIG. 1, drives a NOR gate 10 at the last stage by utilizing a set pulse SET for controlling the timing of the rise of the output OUT and a reset pulse RESET for controlling the timing of the fall of the output OUT and by propagating the control pulses SET and RESET respectively via the inverters in multi-stage structures. As shown in FIG. 3, the NOR gate 10 at the last stage consists of transistors P17, P18, N19 and N20.

The inverters in each inverter array consist of alternately combined imbalance-sized transistors and, in the figure, the large-sized transistors are depicted large and the small-sized transistors are depicted small. The leading edge of the set pulse SET is propagated through nodes n11, n12 and n13 in an inverter array INV10–12 and drives a transistor P17 of the NOR gate at the last stage to activate the output OUT. On the other hand, the leading edge of the reset pulse RESET being delayed by the amount of the output pulse width from the set pulse SET is also propagated through nodes n14, n15 and n16 in an inverter array INV15–17 and drives a transistor N20 of the NOR gate at the last stage to deactivate the output OUT.

By providing the reset pulse RESET and the inverter array INV15–17 for propagating it and driving the gate 10 at the last stage, the fall of the output pulse OUT can be controlled and the delay of the fall of the output pulse can be minimized through using not the trailing edge of the set pulse SET but the leading edge of the reset pulse RESET.

By replacing the NOR gate 10 at the last stage of this pulse generation circuit with a NAND gate and an inverter, a similar pulse generation circuit can also be constituted. In such case, the phase of the control pulse is inverted.

Figure 5:
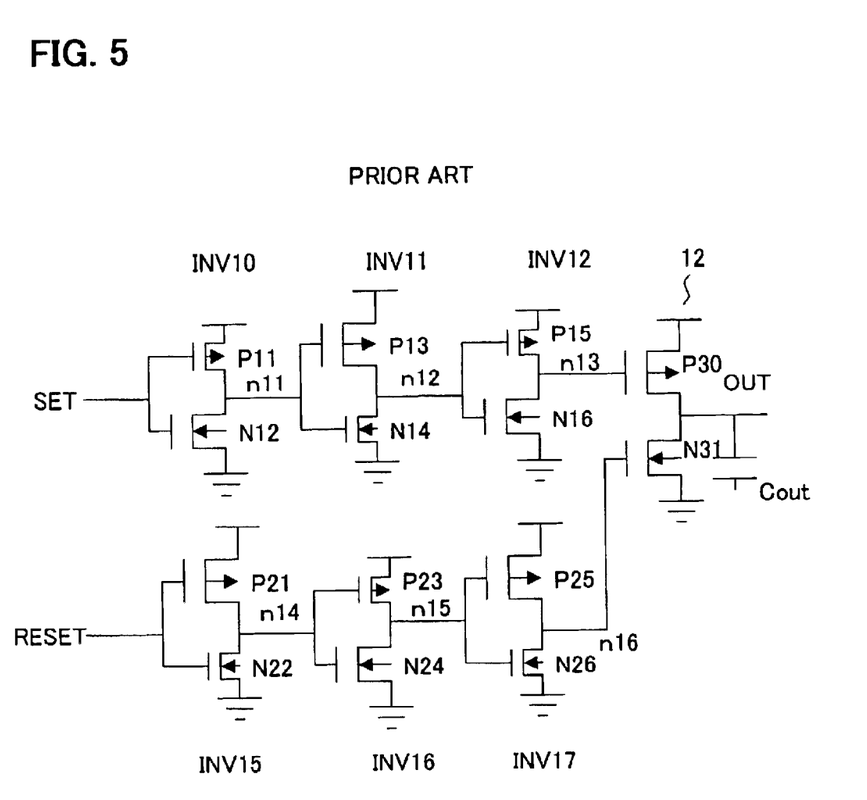
FIG. 5 is a circuit diagram illustrating yet another conventional pulse generation circuit.

FIG. 5 illustrates yet another conventional pulse generation circuit. The operational waveform of the pulse generation circuit shown in FIG. 5 is illustrated in FIG. 4. The pulse generation circuit shown in FIG. 5 has an output stage gate circuit 12 consisting of a p-channel transistor P30 and an N-channel transistor N31 instead of the NOR gate 10 at the last stage in the pulse generation circuit shown in FIG. 3.

In this pulse generation circuit, the output pulse OUT is raised to an activation level (H level) by propagating the leading edge of the set pulse SET to drive the transistor P30 at the last stage. The output pulse OUT is fallen to a deactivation level (L level) by propagating the leading edge of the reset pulse RESET to drive the transistor N31 at the last stage. Therefore, this pulse generation circuit can also prevent the fall of the output pulse of the pulse generation circuit from being delayed by the process variations as shown in FIG. 1.

The pulse generation circuit shown in FIG. 3 has a last stage that is a NOR gate or a NAND gate. When it is a NOR gate, as shown in FIG. 3, the circuit for raising the output pulse consists of the transistors P17 and P18 connected in series and the output pulse is raised when these transistors become conductive. Therefore, this pulse generation circuit has a problem that the drive capability can not be enhanced so much, even though enlarging the size of the transistors P17 and P18, due to the influence of the series resistance of these transistors when driving the output terminal OUT. Furthermore, it is necessary for the size of the four transistors in the NOR gate to be made large and there is another problem that the area of the circuit becomes large comparing to an inverter.

Similarly, even when the last stage consists of a combination of a NAND gate and an inverter, the circuit for decreasing the output of the NAND gate is a circuit consisting of two n-channel transistors connected in series and the drive capability of the circuit for decreasing the outout of the NAND gate is lowered due to the series resistance of the circuit as is the NOR gate. Furthermore, a problem that the area of the circuit becomes large arises when the size of all the output stage transistors whose number is increased is madelarge.

On the other hand, since the pulse generation circuit shown in FIG. 5 has an output stage gate structured as an inverter consisting of two transistors, there is no problem of the increase of the area of the circuit or the lowering of the drive capability, as with the pulse generation circuit shown in FIG. 3. However, as shown in FIG. 4, the trailing edge of the set pulse SET is delayed while propagating through the nodes n11, n12 and n13 because of being influenced by the process variation due to the imbalance sizes of the transistors of the inverters INV10–12. As a result, the L level at the node n13 and the H level at the node n16 overlap each other at a time dt2, both of the transistors P30 and N31 at the output stage gate 12 become conductive and a penetrating current flows. Since the size of the transistors at the output stage gate 12 is large, this penetrating current is not preferable because it results in an increase of power consumption.

Therefore, it is necessary to delay the timing of the leading edge of the reset pulse to prevent this penetrating current and, as a result, the pulse width of the output pulse can not be narrowed and the cycle of the output pulse can not be shortened. The pulse width of the output pulse can not be made narrower than the pulse width of the set pulse. Furthermore, because the trailing edge of the set pulse is delayed by the process variations, the pulse width of the output pulse can not be narrowed due to the delay.

SUMMARY OF THE INVENTION

The object of the invention is to provide a pulse generation circuit that can shorten the cycle of the output pulse generated in response to a control pulse and that can generate the output pulse without delay to the control pulse.

In order to achieve the above object, according to an aspect of the present invention, there is provided a pulse generation circuit for generating an output pulse that is set to its activated level in response to a leading edge of a set pulse, the pulse generation circuit comprising an output stage gate having a first output transistor for having the output pulse to be activated level and a second output transistor for having the output pulse to be deactivated level; a first inverter array, including a plurality of inverters connected in series, for propagating the set pulse and driving the first output transistor; a second inverter array, including a plurality of inverters connected in series, for propagating a reset pulse controlling the deactivation of the output pulse and for driving the second output transistor. To prevent the pulse edge corresponding to the trailing edge of the set pulse from being delayed, the pulse generation circuit comprises a reset transistor disposed at an inverter output in the first inverter array, for driving the pulse edge at the inverter output corresponding to the trailing edge of the set pulse, in response to the reset pulse propagating through the second inverter array.

According to the aspect of the invention, since a reset transistor drives the trailing edge of the propagating set pulse in response to the reset pulse, the trailing edge of the propagating set pulse is prevented from being delayed due to the inverters of the first inverter array. Therefore, the reset pulse can be generated from the leading edge of the set pulse at an earlier timing and the pulse width of the output pulse can be narrowed so as to shorten the cycle of the output pulse.

In a preferred embodiment of the invention, each of inverters in the first inverter array has a first inverter transistor for driving the pulse edge corresponding to the leading edge of the set pulse and a second inverter transistor smaller in size than the first inverter transistor, for driving the pulse edge corresponding to the trailing edge of the set pulse, and the reset transistor is provided in parallel to the second inverter transistor.

In this embodiment, transistors in each inverter in a first inverter array are in imbalance structures and the propagation velocity of the leading edge of the set pulse can be increased. However, the delay of the trailing edge of the set pulse can be prevented by reset transistors.

In another preferred embodiment of the invention, each of inverters in the first inverter array has a first inverter transistor for driving a pulse edge corresponding to the leading edge of the set pulse, and the reset transistor is provided at the power supply side opposite to the first inverter transistor. Being different from the above embodiment, this embodiment does not have the second inverter transistor for driving the pulse edge corresponding to the trailing edge of the set pulse.

In this embodiment, the propagation velocity of the leading edge of the set pulse can be increased and the second inverter transistor can be omitted. Therefore, the scale of the circuit can be made small.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

An exemplary embodiment of the invention will be described referring to the attached drawings. However, the scope of the invention is not limited to the following exemplary embodiment but covers the invention disclosed in the appended claims and its equivalents.

Figure 6:
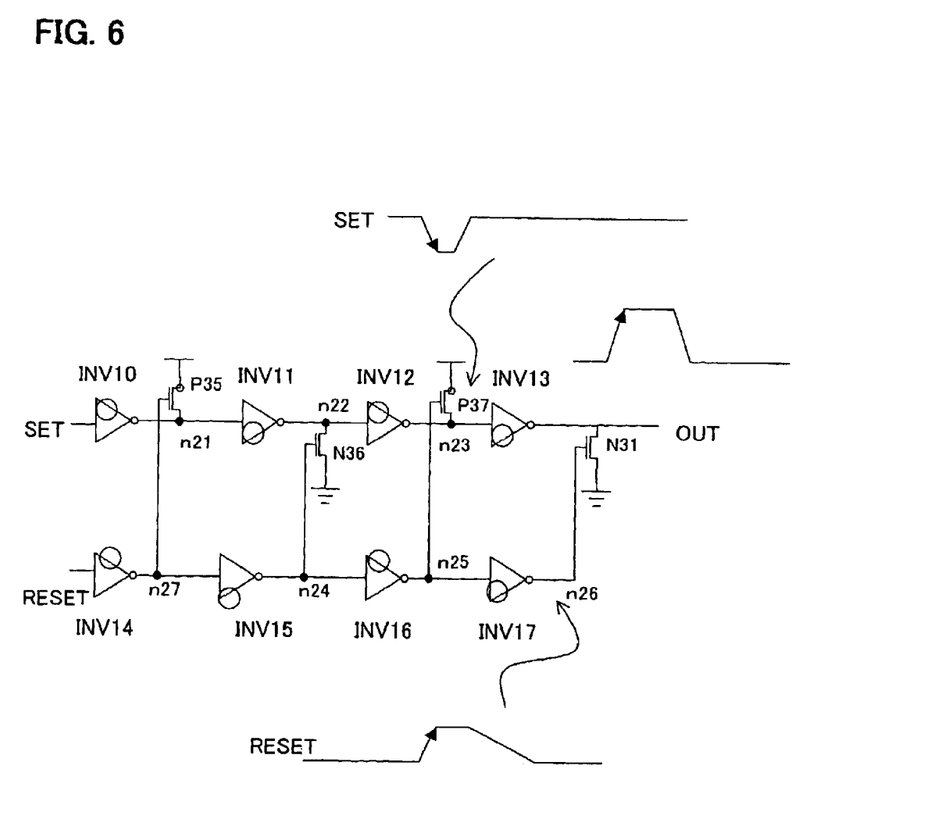
FIG. 6 is a schematic view of a pulse generation circuit according to an embodiment of the invention.

FIG. 6 illustrates a schematic view of a pulse generation circuit of the embodiment. The same reference numbers as in FIG. 3 and FIG. 5 are given to the components in FIG. 6 that correspond to the components of the pulse generation circuit shown in FIG. 3 and FIG. 5. In FIG. 6, inverters INV10–12 constitute a first inverter array that propagates a set pulse SET and the pulse drives an inverter INV13 at the last stage gate to activate an output pulse OUT to the H level. Inverters INV14–17 constitute a second inverter array that propagates a reset pulse and it drives an n-channel transistor N31 at the last stage to deactivate the output pulse OUT to the L level. In this embodiment, the H level and the L level of the output level correspond respectively to the activated level and the deactivated level.

Each inverter in the first inverter array INV10–13 is an imbalance-type inverter consisting of a large-sized transistor for driving the leading edge of the set pulse and a small-sized transistor for driving the trailing edge. In FIG. 6, the positions of the small-sized transistors are indicated by circles in the symbol of inverter.

The inverter INV13 and the transistor N30 constitute the output stage gate at the last stage and the pulse waveforms at the nodes n23 and n26 for respectively driving the inverter INV13 and the transistor N30 are shown in FIG. 6. That is, the p-channel transistor of the inverter INV13 is driven by the leading edge of the propagated set pulse SET and the output pulse is set to the activated level, and the transistor N30 is driven by the leading edge of the propagated reset pulse RESET and the output pulse is set to the deactivated level.

Reset transistors P35, N36 and P37 for being driven by the leading edge of the propagated reset pulse RESET and for driving the trailing edge of the propagating set pulse SET are provided respectively at an output terminal of each inverter in the first inverter array INV10–13. Since these reset transistors are driven by the leading edge of the propagated reset pulse RESET at the same timing as or an earlier timing than the trailing edge of the propagating set pulse SET, the trailing edge of the propagating set pulse SET can be prevented from delaying by driving steeply the trailing edge of the propagating set pulse. Since the trailing edge of the set pulse is driven by the reset transistor in each inverter stage, the trailing edge of the set pulse is prevented from delaying while propagating through the first inverter array INV10–13.

Figure 7:
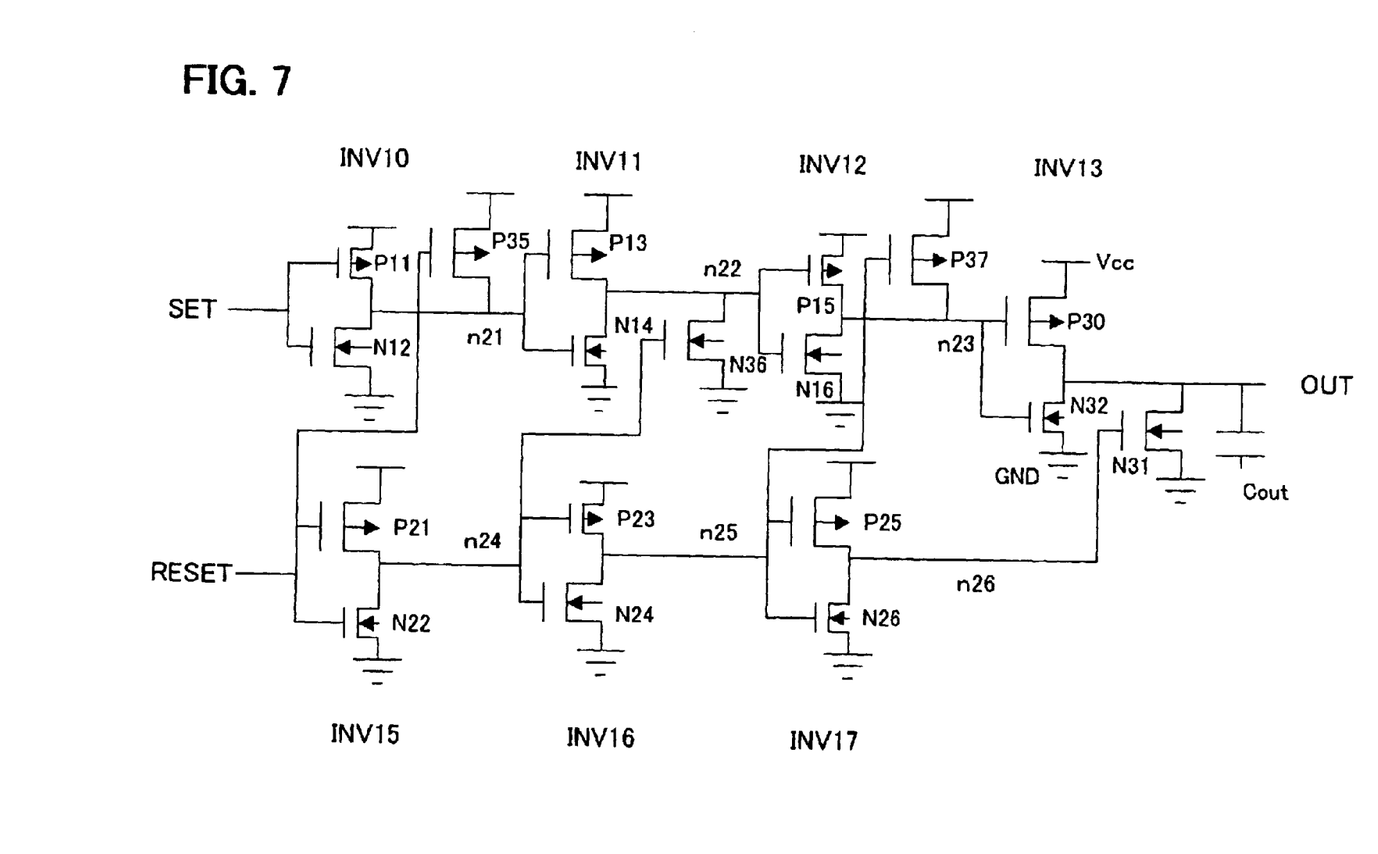
FIG. 7 is a detailed circuit diagram illustrating the pulse generation circuit according to the embodiment.
Figure 8:
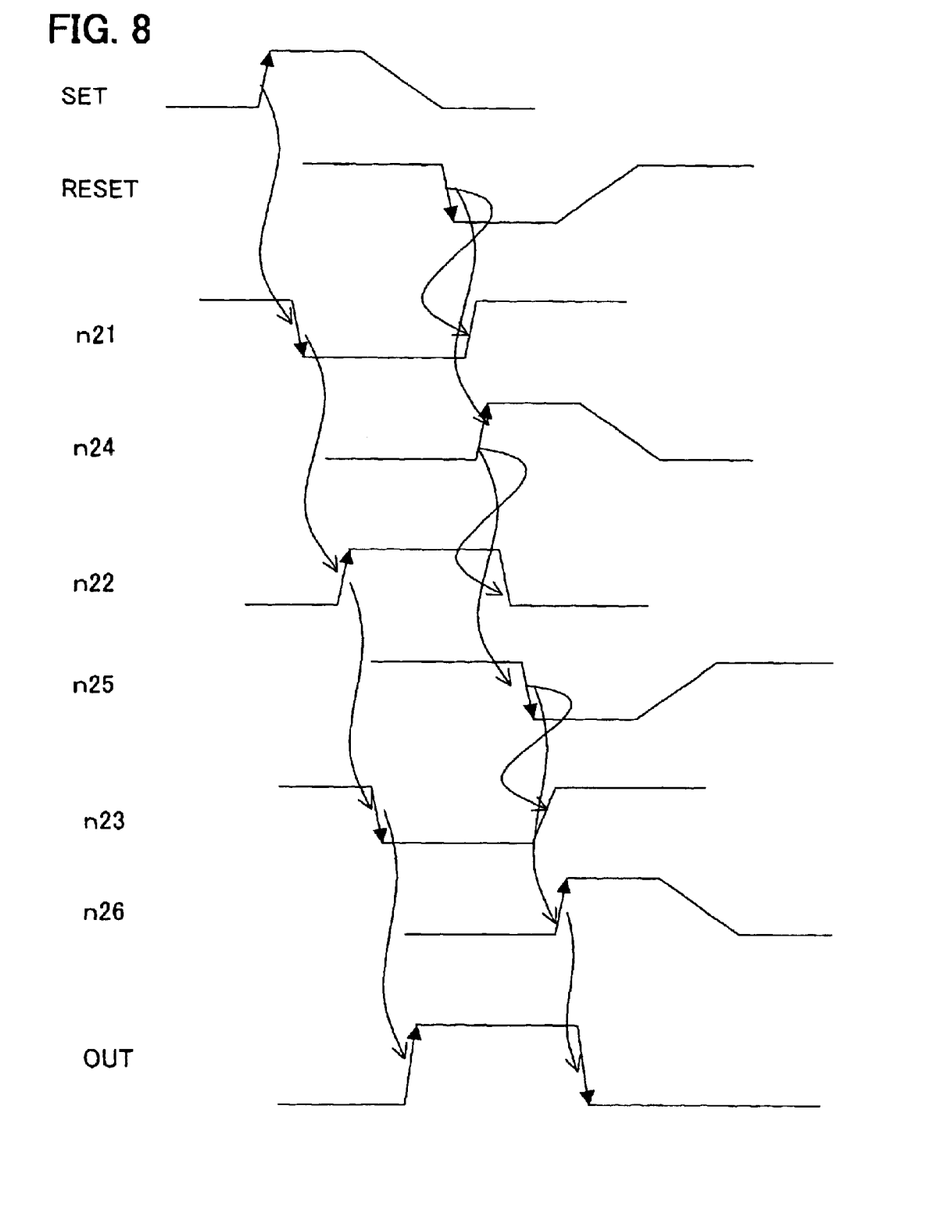
FIG. 8 is a chart illustrating the operational waveforms of the pulse generation circuit shown in FIG. 7.

FIG. 7 illustrates a detailed circuit diagram of the pulse generation circuit according to the embodiment. FIG. 8 illustrates the operational waveforms of the pulse generation circuit according to the embodiment. The inverter INV14 in FIG. 5 is omitted in FIG. 7 and the same reference numbers as in FIG. 3 and FIG. 5 are given to the components in FIG. 7 that correspond to the components of the pulse generation circuit shown in FIG. 3 and FIG. 5.

In the inverters INV10, INV11 and INV12 in the first inverter array, the transistors N12, P13 and N16 on the side for driving the leading edge of the propagating set pulse SET are made larger than the transistors P11, N14 and P15 on the side for driving the trailing edge thereof. Therefore, the propagation time of the leading edge can be shortened as a whole by minimizing the delay of the leading edge of the propagating set pulse SET by minimizing the input load capacitance of each inverter.

Similarly, in the inverters INV15, INV16 and INV17 in the second inverter array, the transistors P21, N24 and P25 on the side for driving the leading edge of the propagating reset pulse RESET are made larger than the transistors N22, P23 and N26 on the side for driving the trailing edge thereof. Therefore, the delay of the propagating reset pulse RESET can be minimized by minimizing the input load capacitance of each inverter.

Therefore, as shown in FIG. 8, the transistor N12 becomes conductive, in response to the leading edge of the set pulse SET, to pull down the leading edge at a node n21. Then, in response to the above, the transistor P13 becomes conductive and raises the leading edge at a node n22. Furthermore, in response to the above, the transistor N16 becomes conductive and pulls down the leading edge at a node n23. Then, in response to the leading edge at the node n23, the transistor P30 of the output stage gate becomes conductive and raises the output pulse OUT for activation. In response to the trailing edge of the set pulse SET, the transistors P11, N14 and P15 become conductive and the transistor P11 raises the node n21, the transistor N14 pulls down the node n22 and the transistor P15 raises the node n23. However, since the size of the transistors P11, N13 and P15 is small, a propagation delay is generated to the trailing edge of the propagating set pulse SET with the variation of their drive capability caused by the process variations.

On the other hand, the leading edge of the reset pulse RESET is also driven by the transistors P21, N24 and P25 respectively in the inverters INV15, INV16 and INV17 and raises a node n24, pulls down a node n25 and raises a node n26. Since the size of these transistors is large, the transistor N31 at the output stage is driven by the rising edge at the node n26 and the output pulse OUT is deactivated.

Therefore, as shown in FIG. 8, by generating the leading edge of the reset pulse RESET after a predetermined time period has passed from the leading edge of the set pulse SET, the pulse width of the output pulse can be controlled almost accurately to the above predetermined time period. By generating the leading edge of the reset pulse RESET at an earlier timing than that of the trailing edge of the set pulse SET, the pulse width of the output pulse OUT can be made narrower than the pulse width of the set pulse SET.

Furthermore, in the embodiment, the reset transistors P35, N36 and P37 for driving the trailing edge of the propagating set pulse SET are provided at the inverter output of the first inverter array INV10–13 propagating the set pulse SET. Since these reset transistors are respectively driven in response to the leading edge of the propagating reset pulse RESET, regardless of the operation of the small transistors P11, N13 and P13 in the inverters, these reset transistors drive the trailing edge of the pulse generated at the output nodes n21, n22 and n23 of the inverters and can reset that pulse very quickly.

It is preferable to make the size of each reset transistor larger than the size of the transistors on the side for driving the trailing edge of the first inverter array.

The reset transistors P35, N36 and P37 are driven respectively by the falling edge of the reset pulse RESET, the rising edge at the node n24 and the falling edge at the node n25. These drive pulse edges are the pulse edges corresponding to the leading edge of the propagating reset pulse RESET. In addition, it is preferable that the pulse edge for driving each reset transistor is the pulse edge corresponding to the leading edge of the reset pulse RESET generated at the output of the previous stage inverter. According to that, the trailing edge of the set pulse SET can be driven at an earlier timing than or almost same timing as that of the leading edge of the reset pulse RESET in the same stage. Therefore the propagating reset pulse RESET and the set pulse SET can be prevented from being at the activated level at the same time.

However, the drive pulse edges for the reset transistors P35 and P37 are only required to be falling edges and the drive pulse edge for the reset transistor N36 is only required to be a rise edge. Therefore, when the timing is appropriate, the transistor P35 can be driven by the pulse at the node n25 that is behind the transistor P35 and the transistor N36 can be driven by the pulse at the node n26 that is behind the transistor N36. Even in this case, it is necessary that the L level at the node n23 and the H level at the noden 26 for driving the transistor P30 and N31 at the last stage do not overlap.

Since, by providing these reset transistors P35, N36, P37, the trailing edge at the output nodes n21, n22 and n23 in the first inverter array is driven by the leading edge of the propagating reset pulse RESET having a small propagation delay, the trailing edge of the propagating set pulse SET can be prevented from being delayed. As a result, there is no delay as with the trailing edge at the node n13 in the conventional example shown in FIG. 4. Furthermore, as shown in FIG. 8, it is prevented that the trailing edge at the node n23 for driving the output stage is delayed, the L level at the node n23 and the H level at the node n26 overlap, and the transistors P30 and N31 at the output stage become conductive at the same time so that the penetrating current flows.

In the pulse generation circuit shown in FIG. 7, it is necessary to prevent that the transistors P30 and N31 at the output stage become conductive at the same time. Therefore, it is at least necessary to eliminate the delay of rising edge at the node n23 by providing a reset transistor P37. In such a case, the reset transistors N36 and P35 at the output terminals of the inverters before the node n23 can be omitted. Alternatively, reset transistors can be provided only at certain positions where needed among the inverter output terminals of the first inverter array INV10–13, except the node n23.

It is not necessary that the sizes of the transistors of each inverter are imbalance in the pulse generation circuit shown in FIG. 7. However, in such a case, the input capacitance of each inverter becomes large and the propagation delay of the set pulse and the reset pulse becomes large. However, the leading edge and the trailing edge of the output pulse out are controlled respectively by the leading edge of the set pulse SET and the leading edge of the reset pulse RESET, further, it is prevented that the transistors P30 and N31 of the output stage gate are made conductive at the same time according to the reset transistors.

Figure 9:
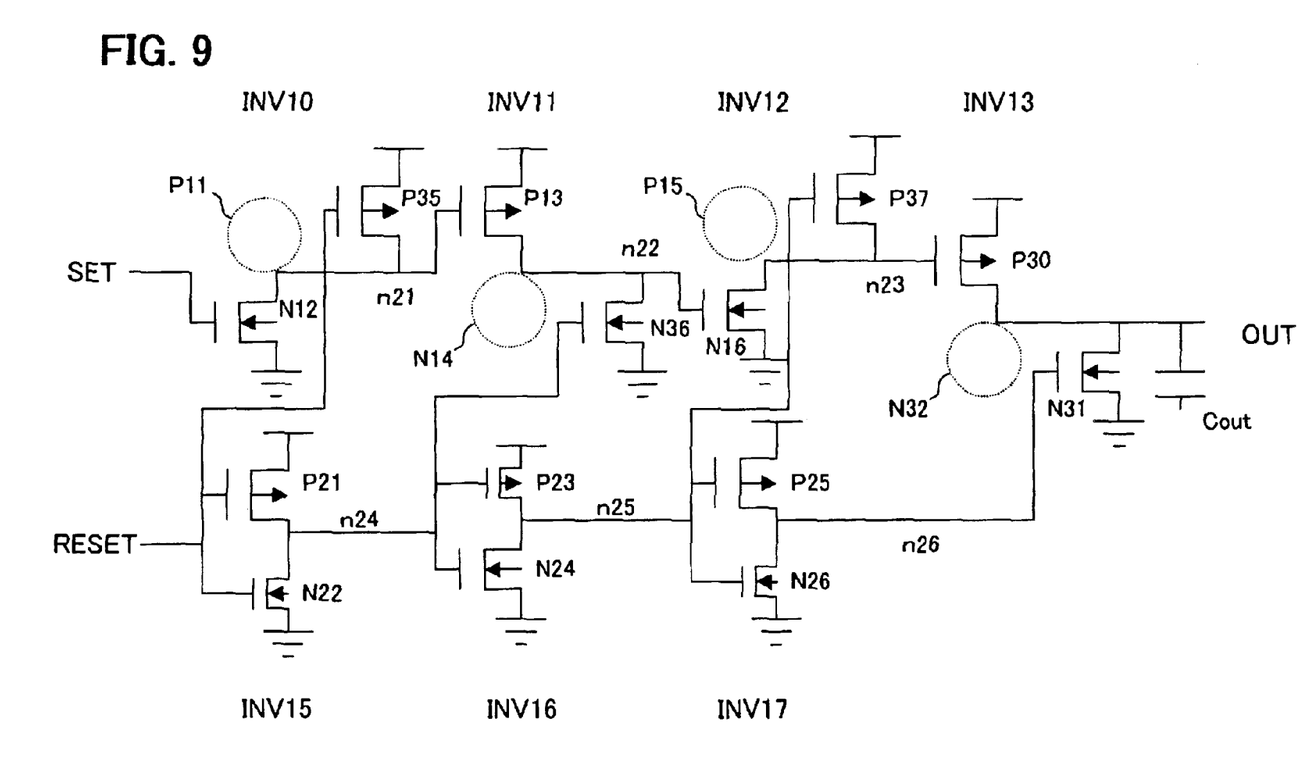
FIG. 9 is a detailed circuit diagram of the pulse generation circuit of a modification of the embodiment.

FIG. 9 illustrates a detailed circuit diagram of a pulse generation circuit according to a modification of the embodiment. The small-sized transistors P11, N14, P15 and N32 in each inverter in the first inverter array INV10–13 in FIG. 7 are omitted in this modification. Therefore, the positions for these transistors are indicated with circles of dotted line in FIG. 9.

The operational waveforms shown in FIG. 8 can also be applied to this modified pulse generation circuit. The transistor N12 becomes conductive in response to the leading edge of the set pulse SET and pulls down the node n21. The reset transistor P35 becomes conductive and raises the node n21 in response to the leading edge of the reset pulse RESET having arrived at the timing same as or earlier than the timing of the deactivation of the set pulse SET. Since the reset transistor P35 becomes conductive at the timing same as or earlier than the timing of the omitted transistor P11, the transistor P11 can be omitted.

The transistor N14 in the inverter INV11 can be omitted for the same reason. The transistor P15 in the inverter INV12 and the transistor N32 in the inverter INV13 can also be omitted for the same reason. However, it is necessary to prevent that the transistors N12, P13 and N16 in each inverter become nonconductive at the trailing edge of the propagating set pulse SET before the nodes n21, n22 and n23 are reset by the reset transistors P35, N36 and P37 due to the omission of the transistors P11, N14, P15 and N32, so that the nodes n21, n22 and n23 are set to a high impedance state. Therefore, it is preferable that the timing of a pulse edge for driving the reset transistors P35, N36 and P37 is earlier than the trailing edge of the propagating set pulse SET input into an inverter at the same stage in the first inverter array. That is, it is preferable that the leading edge of the propagating reset pulse RESET for controlling the reset transistors is the leading edge of the reset pulse generated at the inverter output at the previous stage rather than at the inverter output at the stage of each reset transistor.

Yet, in the pulse generation circuit shown in FIG. 9, only part of the transistors P11, N14, P15 and N32 may be omitted. When it is impossible to realize the timing for preventing the above-described high-impedance state, it is preferable to prevent each node from being set to the high-impedance state by not omitting those transistors P11, N14, P15 and N32 as shown in FIG. 7.

The above pulse generation circuit can shorten the drive cycle of a word line by applying the circuit to the word line drive circuit in semiconductor memories such as SRAM. In addition to that, it is preferable to utilize the circuit as a pulse generation circuit for supplying a pulse to a node having a large load in response to a trigger pulse.

According to the pulse generation circuit of the invention, by providing reset transistors for resetting the trailing edge of the propagating set pulse at inverter output terminals in the first inverter array for propagating the set pulse, the delay of the trailing edge of the propagating set pulse can be minimized, the transistors in the output stage gate can be prevented from becoming conductive at the same time, and an output pulse having a fast and stable pulse width can be generated.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A pulse generation circuit for generating an output pulse with an activated level in response to a leading edge of a set pulse, the pulse generation circuit comprising:
    an output stage gate having a first output transistor for setting the output pulse to be activated level and a second output transistor for setting the output pulse to be deactivated level, wherein a drain of the first output transistor and a drain of the second output transistor are each connected to an outout of the output stage gate;
    a first inverter array, including a plurality of inverters connected in series, for propagating the set pulse and driving the first output transistor;
    a second inverter array, including a plurality of inverters connected in series, for propagating a reset pulse controlling deactivation of the output pulse and for driving the second output transistor; and
    at least one reset transistor, wherein a drain of the at least one reset transistor is connected to an output of a corresponding one of the plurality of inverters of the first inverter array, for driving the pulse edge at the inverter output corresponding to a trailing edge of the set pulse, in response to the reset pulse propagating through the second inverter array.

2. The pulse generation circuit according to claim 1, wherein each of the inverters in the first inverter array has a first inverter transistor for driving the pulse edge corresponding to the leading edge of the set pulse and a second inverter transistor smaller in size than the first inverter transistor, for driving the pulse edge corresponding to the trailing edge of the set pulse, and the reset transistor is provided in parallel to the second inverter transistor.

3. The pulse generation circuit according to claim 2, wherein the reset transistor is larger in size than the second inverter transistor.

4. The pulse generation circuit according to claim 1, wherein each of the inverters in the first inverter array has a first inverter transistor for driving a pulse edge corresponding to the leading edge of the set pulse, and the reset transistor is provided at a power supply side opposite to the first inverter transistor.

5. The pulse generation circuit according to claim 1, wherein the reset transistor is provided at least at an output of a last stage inverter in the first inverter array, and the transistor of the output stage gate is driven by the output of the last stage inverter.

6. The pulse generation circuit according to claim 2, wherein the propagating reset pulse for driving the reset transistor is a propagating reset pulse of an inverter output at a preceding stage to an inverter output, at which the reset transistor is provided, in the second inverter array.

7. The pulse generation circuit according to claim 1, wherein the second output transistor and the reset transistor are driven by the propagating pulse edge corresponding to the leading edge of the reset pulse.

8. The pulse generation circuit according to claim 1, wherein the pulse width of the output pulse is smaller than the pulse width of the set pulse.

9. A pulse generation circuit for generating an output pulse that is driven to an activated level in response to a leading edge of a set pulse and that is driven to a deactivated level in response to a leading edge of a reset pulse, the pulse generation circuit comprising:
    an output stage gate having a first output transistor for setting the output pulse to the activated level and a second output transistor for setting the output pulse to the deactivated level, wherein an output of the first output transistor and a drain of the second output transistor are each connected to an output of the output stage gate;
    a first inverter array, including a plurality of inverters connected in series, for propagating the set pulse and driving the first output transistor;
    a second inverter array, including a plurality of inverters connected in series, for propagating the reset pulse and driving the second output transistor; and
    at least one reset transistor, wherein a drain of the at least one reset transistor is connected to an output of a corresponding one of the plurality of inverters of the first inverter array and driven in response to a leading edge of the reset pulse propagating through the second inverter array.

10. The pulse generation circuit according to claim 9, wherein each of inverters in the first inverter array has a first inverter transistor for driving a pulse edge corresponding to the leading edge of the set pulse and a second inverter transistor smaller in size than the first inverter transistor, for driving a pulse edge corresponding to the trailing edge of the set pulse, and the reset transistor is provided in parallel to the second inverter transistor.

11. The pulse generation circuit according to claim 10, wherein the reset transistor is larger in size than the second inverter transistor.

12. The pulse generation circuit according to claim 9, wherein each of inverters in the first inverter array has a first inverter transistor for driving a pulse edge corresponding to the leading edge of the set pulse, and the reset transistor is provided at a power supply side opposite to the first inverter transistor.

13. The pulse generation circuit according to claim 9, wherein the reset pulse drives the trailing edge of the propagating set pulse.

14. A pulse generation circuit for generating an output pulse that is set to an activated level in response to a leading edge of a set pulse, the pulse generation circuit comprising:
    an output stage gate having a first output transistor for setting the output pulse to the activated level and a second output transistor for setting the output pulse to a deactivated level, wherein an output of the first output transistor and a drain of the second output transistor are each connected to an output of the output stage gate;
    a transistor array, having a plurality of propagation transistors, for propagating a pulse edge corresponding to the leading edge of the set pulse and for driving the first output transistor;

an inverter array, including a plurality of inverters connected in series, for propagating a reset pulse that controls the deactivation of the output pulse and for driving the second output transistor; and a reset transistor for driving a pulse edge corresponding to the trailing edge of the set pulse, in response to the reset pulse propagating through the inverter array;

wherein the transistor array is arranged such that the drain of each of the propagation transistors is connected to the gate of a propagation transistor at the next stage, and a drain of the reset transitor is provided at a connection node of a corresponding one of the plurality of propagation transistors.

15. The pulse generation circuit according to claim 14, wherein the transistor array is arranged such that the source of each of the propagation transistors is connected to a power source potential opposite to a power source potential of having an adjacent propagation transistor, and each of the plurality of reset transistors is provided at a power source side opposite to the propagation transistor in a preceding stage to the connecting node.

* * * * *